（12） United States Patent
Mardi

(10) Patent No.: US 10,367,279 B2
(45) Date of Patent: Jul. 30, 2019

(54) PUSHER PIN HAVING A NON-ELECTRICALLY CONDUCTIVE PORTION

(71) Applicant: Xilinx, Inc., San Jose, CA (US)

(72) Inventor: Mohsen H. Mardi, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/794,479

(22) Filed: Oct. 26, 2017

(65) Prior Publication Data

US 2019/0131728 A1    May 2, 2019

(51) Int. Cl.

| | |
|---|---|
| *H01R 11/18* | (2006.01) |
| *H01R 12/70* | (2011.01) |
| *H01R 13/24* | (2006.01) |
| *H01R 24/50* | (2011.01) |
| *H01R 13/6599* | (2011.01) |
| *H01R 12/71* | (2011.01) |
| *H01R 107/00* | (2006.01) |
| *G01R 1/04* | (2006.01) |

(52) U.S. Cl.
CPC ....... *H01R 12/7076* (2013.01); *H01R 12/714* (2013.01); *H01R 13/2421* (2013.01); *H01R 13/6599* (2013.01); *H01R 24/50* (2013.01); *G01R 1/045* (2013.01); *G01R 1/0483* (2013.01); *H01R 2107/00* (2013.01)

(58) Field of Classification Search
CPC .............. G11C 11/1675; G11C 7/1078; G11C 13/0023; G11C 13/0028; G11C 13/0069; G11C 11/5678; G11C 7/1072; G11C 7/12; G11C 7/222; G11C 7/1096

USPC ...... 439/700, 482, 824, 70, 264, 525, 41, 42
See application file for complete search history.

(56) References Cited

U.S. PATENT DOCUMENTS

| | | | | |
|---|---|---|---|---|
| 2,020,402 | A | * | 11/1935 | Edwards ............ G01R 1/06788 200/1 A |
| 2,857,572 | A | * | 10/1958 | Belart ................ G01R 1/06788 324/149 |
| 3,753,103 | A | * | 8/1973 | Tetreault ............ G01R 1/06722 324/72.5 |
| 4,321,532 | A | * | 3/1982 | Luna ................. G01R 1/06722 324/72.5 |
| 4,783,624 | A | * | 11/1988 | Sabin ................ G01R 1/06722 324/72.5 |

(Continued)

*Primary Examiner* — Abdullah A Riyami
*Assistant Examiner* — Nelson R. Burgos-Guntin
(74) *Attorney, Agent, or Firm* — Keith Taboada

(57) ABSTRACT

An electrically insulative pusher pin is disclosed. In one example, an electrically insulative pusher pin includes a first plunger member, a second plunger member, and a spring. The first plunger member has a first end and an exposed second end. The second plunger member has a first end and an exposed second end. The second plunger member is movable relative to the first plunger member, where the exposed second ends of the first and second plunger members defining a length of the pusher pin. The spring disposed between the first ends of the first and second plunger members and biases the exposed second end of the first plunger member away from the exposed second end of the second plunger member. An electrically insulative path is defined between the exposed second end of the first plunger member and the exposed second end of the second plunger member through the pusher pin.

20 Claims, 13 Drawing Sheets

(56) References Cited

U.S. PATENT DOCUMENTS

| | | | | |
|---|---|---|---|---|
| 4,904,213 A * | 2/1990 | Hock | G01R 1/067 | 439/482 |
| 4,918,384 A * | 4/1990 | Giringer | H01R 11/18 | 324/72.5 |
| 5,014,004 A * | 5/1991 | Kreibich | H01R 11/18 | 267/168 |
| 5,151,040 A * | 9/1992 | Tanaka | G01R 1/0466 | 439/700 |
| 5,225,773 A * | 7/1993 | Richards | G01R 1/06722 | 200/61.76 |
| 5,458,500 A * | 10/1995 | Aikawa | G01R 31/045 | 439/310 |
| 5,744,977 A * | 4/1998 | Cuautla | G01R 1/06722 | 324/755.05 |
| 5,936,421 A * | 8/1999 | Stowers | G01R 15/12 | 324/750.27 |
| 6,194,892 B1 * | 2/2001 | Lin | G11B 5/5552 | 324/207.16 |
| 6,229,416 B1 * | 5/2001 | Ebihara | H01H 51/065 | 335/127 |
| 6,256,202 B1 * | 7/2001 | Murphy | H01L 23/4006 | 165/80.2 |
| 6,464,511 B1 * | 10/2002 | Watanabe | G01R 1/07371 | 439/66 |
| 6,819,130 B2 * | 11/2004 | Abazarnia | G01R 31/2886 | 324/750.25 |
| 7,001,199 B1 * | 2/2006 | Badalpour | H01R 13/6276 | 439/348 |
| 8,083,552 B2 * | 12/2011 | Oishi | H01R 13/2421 | 439/700 |
| 8,506,307 B2 * | 8/2013 | Henry | G01R 1/06738 | 439/482 |
| 8,547,128 B1 * | 10/2013 | Sochor | G01R 1/06722 | 324/750.25 |
| 9,947,560 B1 * | 4/2018 | Mardi | H01L 21/4817 | |
| 2002/0011434 A1 * | 1/2002 | Kuennen | A61L 2/10 | 210/97 |
| 2003/0124895 A1 * | 7/2003 | Winter | G01R 1/0466 | 439/219 |
| 2008/0014801 A1 * | 1/2008 | Milette | H01R 4/242 | 439/638 |
| 2010/0264935 A1 * | 10/2010 | Erdman | G01R 1/0466 | 324/537 |
| 2011/0008987 A1 * | 1/2011 | Szu | H05K 7/1053 | 439/348 |
| 2013/0065455 A1 * | 3/2013 | Kawata | G01R 1/0483 | 439/700 |
| 2013/0203298 A1 * | 8/2013 | Zhou | G01R 1/06722 | 439/700 |
| 2014/0099840 A1 * | 4/2014 | Kargilis | B60R 16/023 | 439/817 |
| 2015/0280370 A1 * | 10/2015 | Huang | H01R 24/46 | 439/188 |
| 2016/0118738 A1 * | 4/2016 | Nasu | G01R 1/06722 | 439/700 |
| 2018/0212352 A1 * | 7/2018 | Zhu | H01R 13/4538 | |

* cited by examiner

PUSHER PIN HAVING A NON-ELECTRICALLY CONDUCTIVE PORTION

BACKGROUND

Field

Examples of the present disclosure generally relate to a pusher pin. In particular, examples of the present disclosure relate to a pusher pin having an electrically non-conductive portion for use in an automated test assembly.

Description of the Related Art

Electronic devices, such as tablets, computers, server, in-door telecom, out-door telecom, industrial computers, high performance computing data centers, copiers, digital cameras, smart phones, control systems and automated teller machines, among others, often employ electronic components which leverage chip packages for increased functionality and higher component density. Conventional chip packages include one or more stacked components such as integrated circuit (IC) dies, through-silicon-via (TSV) interposer, and a package substrate, with the chip package itself stacked on a printed circuit board (PCB). The IC dies may include memory, logic, MEMS, RF or other IC device.

Prior to incorporation into an electronic device, chip packages are tested to ensure that the performance of the chip packages meet predefined performance criteria. In most conventional automatic test equipment utilized to test chip packages, some type of clamp or actuator is utilized to force the chip package into a test socket that electrically couples the circuitry of the chip package with test circuitry of the automatic test equipment. The actuator of the automatic test equipment is typically coupled to a first end of a workpress. A second end of the workpress has a surface specifically designed to engage the top surface of the chip package while pressing the chip package into the test socket. The actuator is configured to move the workpress to thus apply a force to the top of the chip package, thus urging the chip package into the test socket. Because second surface of the workpress contacting the chip package is typically machined out of aluminum, workpress may not apply force as designed to the chip package due to height differences on the chip package, such as for example differences in height between stiffeners, lids, package substrates and the like. The nonuniform application of force results in some regions of the chip package receiving too much force while other regions not receiving enough force to ensure good electrical connection between the chip package and test socket. Undesirably, this may lead to damage to and poor testing of the chip package. The challenges of applying force as intended increases dramatically in lidless chip packages where differences in die heights may be very varied.

Thus, there is a need for improved equipment and methods for testing chip packages.

SUMMARY

Examples of the present disclosure relate to a pusher pin having an electrically non-conductive portion for use in an automated test assembly. In one example, an electrically insulative pusher pin includes a first plunger member, a second plunger member, and a spring. The first plunger member has a first end and an exposed second end. The second plunger member has a first end and an exposed second end. The second plunger member is movable relative to the first plunger member, where the exposed second ends of the first and second plunger members defining a length of the pusher pin. The spring disposed between the first ends of the first and second plunger members and biases the exposed second end of the first plunger member away from the exposed second end of the second plunger member. An electrically insulative path is defined between the exposed second end of the first plunger member and the exposed second end of the second plunger member through the pusher pin.

In another example, an integrated circuit package test assembly that employs at least one electrically insulative pusher pin is disclosed. The integrated circuit package test assembly includes a workpress, a socket and an actuator. The workpress has a top end and a bottom end. The bottom end of the workpress has a first plurality of pusher pins. The socket has a top end facing the bottom end of the workpress. The top end of the socket has a second plurality of pusher pins. The actuator is configured to move the workpress towards the socket a sufficient distance to cause the first plurality of pins and the second plurality of pins to engage a device under test (DUT) when disposed in the socket. At least a first pusher pin of the first plurality of pusher pins or at least one pusher pin of the second plurality of pusher pins has an open circuit defined between opposite ends of the first pusher pin.

In another example, a method of testing an integrated circuit package in an integrated circuit package test assembly. The method includes contacting a DUT with at least a first non-conductive pusher pin on a top surface or a bottom surface of the DUT, contacting the DUT with at least a first conductive pusher pin on the top surface or the bottom surface of the DUT, and testing the DUT in contact with the first non-conductive pusher pin and the first conductive pusher pin though signals provided through the first conductive pusher pin.

In another example, the method of testing described above may be implemented with a non-conductive pusher pin which is fabricated as an assembled compliant plunger, a stamped or formed plunger, a slider plunger, an H-slider pin, a spring pin, a buckling pin, a cobra pin, a pogo-pin, a microelectromechanical (MEMS) pin or other workpiece pusher suitable for contacting surfaces of a lid-less chip package.

In another example, the method of testing described above may be implemented with a non-conductive pusher pin which has a unitary construction that incorporates a spring form. That is, the non-conductive pusher pin is made from a single mass of material to provide the unitary construction. For example, the unitary construction may be achieved through stamping, machining, MEMS fabrication techniques, 3D printing or other suitable technique.

In another example, the method of testing described above may be implemented with a non-conductive pusher pin which incorporates a compressible, resilient material that allows the pusher pin to change length. The compressible, resilient material may be a foam, an elastomer, plastic spheres or other suitable material.

BRIEF DESCRIPTION OF THE DRAWINGS

So that the manner in which the above recited features of the present invention can be understood in detail, a more particular description of the invention, briefly summarized above, may be had by reference to examples, some of which are illustrated in the appended drawings. It is to be noted, however, that the appended drawings illustrate only typical examples of this invention and are therefore not to be considered limiting of its scope, for the invention may admit to other equally effective examples.

To facilitate understanding, identical reference numerals have been used, where possible, to designate identical elements that are common to the figures. It is contemplated that elements of one example may be beneficially incorporated in other examples.

DETAILED DESCRIPTION

Examples of the disclosure generally provide electrically insulative pusher pins for use in integrated circuit package test assemblies. In first examples described herein, techniques are provided that allow for a distributed force to be applied over a larger contact area, resulting in reduced pressure applied to DUTs, such as integrated circuit chips, integrated circuit chip packages, printed circuit boards, and the like, thereby reducing the risk of die and/or package delamination and die and/or substrate cracks. In second examples described herein, techniques are provided that include an electrically insulative path defined between opposite ends of a pusher pin. The electrically insulative path defined through the pusher pin prevents the pusher pin from inadvertently shorting circuits that may be in contact with the pusher pin when in use with DUTs.

Figure 1:
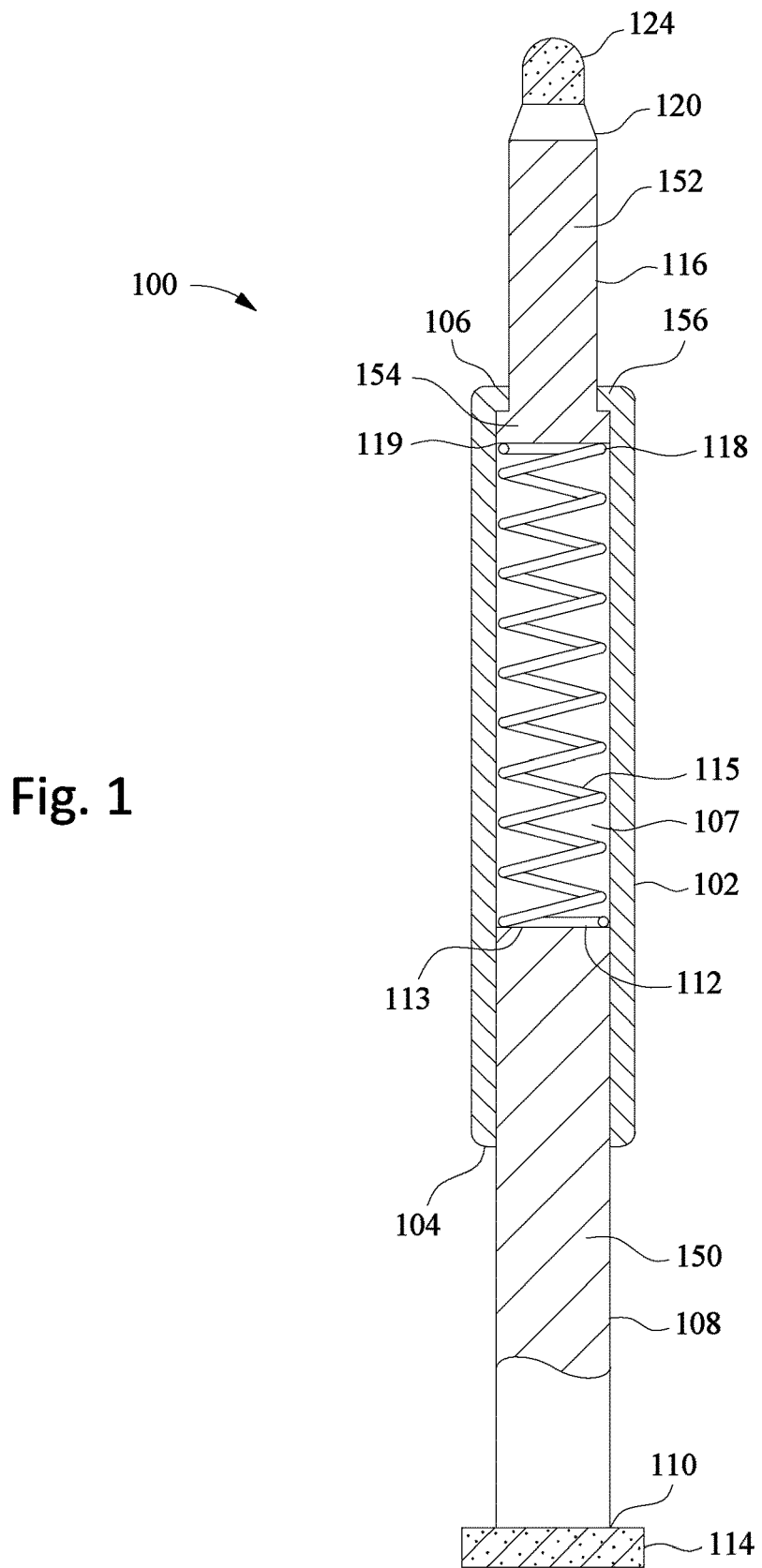
FIG. 1 shows a perspective of an exemplary pusher pin, according to an embodiment.

FIG. 1 show a perspective of an exemplary pusher pin 100. The pusher pin 100, which may be adapted from a pogo pin, spring pin, buckling pin, cobra pin, microelectromechanical (MEMS) pin and the like, includes a first plunger member 108, a second plunger member 116 and a spring 115. In one example, an electrically insulative path is defined between the exposed opposite ends of the first and second plunger members 108, 116 through the pusher pin 100. The electrically insulative path defined through the pusher pin 100 prevents the pusher pin 100 from inadvertently shorting circuits that may be in contact with the pusher pin 100 when in use. It is noted that the pusher pin 100 described herein although for use in DUTs, is not intended for use in locations that require communication of an electric signal, ground or power for which a conventional pusher pin is commonly utilized.

The first plunger member 108 has a body 150. The body 150 includes a first end 113 and a second end 110. The body 150 may be cylindrical or have another sectional geometry. The body 150 may be fabricated from a material suitably rigid enough to withstand an axial compression force exerted on the pusher pin 100 when in use with a DUT. For example, the body 150 is configured to withstand axial compression force of up to about 1000 grams In one example, the body 150 maybe fabricated from a carbon-based materials, fiber-reinforced plastic, metals, rigid polymers or other suitable material. Suitable metals include brass, stainless steel, beryllium copper and titanium, among others. The body 150 maybe fabricated form one or more materials, and in one example, at least a portion of the body 150 is fabricated from a dielectric material so that the body 150 is not conductive from the end 113 to the end 110.

The second plunger member 116 also has a body 152. The body 152 may be fabricated from the same materials as described above with reference to the body 150 of the first plunger member 108. The bodies 150, 152 may be fabricated from the same materials, or fabricated from different materials. In some examples, at least one of the bodies 150, 152 is non-conductive end to end, while in other example, both bodies 150, 150 may be conductive end to end. The body 152 of the second plunger member 116 includes a first end 119 and a second end 120.

The pusher pin 100 may further include a shell 102. The shell 102 optionally may be part of the first plunger member 108. The shell 102 may be fabricated from the same materials as described above with reference to the body 150 of the first plunger member 108. The body 150 and the shell 102 may be fabricated from the same materials, or fabricated from different materials. In some examples, at least one of the body 150 and the shell 102 is non-conductive end to end, while in other example, both the body 150 and shell 102 may be conductive end to end.

The shell 102 has a first end 104 and a second end 106. A cavity 107 is formed through the shell 102 from the first end 104 to the second end 106. The first end 113 of the first plunger member 108 is disposed in the cavity 107 through the first end 104 of the shell 102. In one example, the first end 113 of the first plunger member 108 is fixed in the cavity 107 of the shell 102 so that the first plunger member 108 does not move relative to the shell 102. The first plunger member 108 may be fixed to the shell 102 in any suitable manner. For example, the first plunger member 108 may be fixed to the shell 102 using adhesives, a press fit engagement, a swaged connection, threads, crimping, brazing, welding, fasteners or other suitable technique. In another example, the first end 113 of the first plunger member 108 is movably disposed in the cavity 107 of the shell 102 so that the first plunger member 108 may move axially relative to the shell 102. In such embodiment where it is desirable for the first plunger member 108 to move axially relative to the shell 102, the first end 113 of the first plunger member 108 may be captured in the cavity 107 of the shell 102 as further described below with reference to the engagement of the second plunger member 116 with the cavity 107 of the shell 102.

As just mentioned above, the second plunger member 116 is engaged with the cavity 107 of the shell 102 in a manner that allows for the second plunger member 116 to move axially relative to the shell 102. For example, the first end 119 of the second plunger member 116 is disposed in the cavity 107 through the second end 106 of the shell 102. The shell 102 includes a flange 156 that has an inner diameter sized to allow the body 152 of the second plunger member 116 to extend through the flange 156 so that the second plunger member 116 may be displaced axially through the second end 106 of the shell 102 without significant restriction of movement. The flange 156 may be formed by crimping the shell 102, heading, or other suitable technique. The inner diameter of the flange 156 is smaller than a diameter of a head 154 formed at the second end 106 of the second plunger member 116, thus capturing the second plunger member 116 within the cavity 107 by preventing the second plunger member 116 from completely sliding out of the cavity 107 through the second end 106 of the shell 102. In one example, the second plunger member 116 may be displaced axially through a distance of about 0.5 to about 2.5 millimeters.

The spring 115 is fabricated from a conductive or non-conductive material and is disposed between the first plunger member 108 and the second plunger member 116. The spring 115 biases the first plunger member 108 away from the second plunger member 116. The spring 115 may be disposed within or outside of the shell 102. In the example depicted in FIG. 1, the spring 115 is disposed in the cavity 107 of the shell 102.

For example, the spring 115 has a first end 112 and a second end 118. The first end 112 of the spring 115 is disposed against the first end 113 of the body 150 of the first plunger member 108. The end 118 of the spring 115 is disposed against the first end 119 of the body 152 of the second plunger member 116. The distance between the first end 113 of the body 150 of the first plunger member 108 and the flange 156 of the shell 102 is selected so that the spring 115 generates a determined pre-load force when the second plunger member 116 is fully extended from the shell 102. In one example, the spring 115 is selected to generate a force of between about 0.15 to 1.00 newtons (N) at about half the stroke of the second plunger member 116.

As discussed above, an electrically insulative path is defined through the pusher pin 100. That is, an open circuit is formed between the second ends 110, 120 of the plunger members 108, 116 that defined the length of the pusher pin 100. The electrically insulative path defined through the pusher pin 100 generally prevents the pusher pin 100 from inadvertently shorting circuits that may be in contact with the second ends 110, 120 of the pusher pin 100 when in use. To achieve an electrically insulative path through the pusher pin 100, various elements of the pusher pin 100 may be made of or coated with an electrically insulative material so that an open circuit is formed between exposed second ends 110, 120 of the pusher pin 100. The electrically insulative material may be a ceramic, a form of rubber or latex, plastic, glass, or other suitable electrically insulative material. The electrically insulative material may also be an electrically non-conductive coating applied over a dielectric or conductive base material. The electrically non-conductive coating may comprise a thin film of ceramic, a form of rubber or latex, plastic, glass, or other suitable electrically insulative material.

In the example depicted in FIG. 1, the second end 110 of the first plunger member 108 may include electrically insulative tip 114. The electrically insulative tip 114 may be made from or coated with any of the electrically insulative materials described above, including an electrically non-conductive coating applied over a dielectric or conductive base material, the coating comprised a thin film of ceramic, a form of rubber or latex, plastic, glass, or other suitable electrically insulative material. The electrically insulative tip 114 may be part of the body 150, or be separately connected to the second end 110 of the first plunger member 108. The electrically insulative tip 114 provides an open circuit between the second ends 110, 120 of the pusher pin 100, thus making the pusher pin 100 non-conductive.

Optionally and as additionally shown in FIG. 1, the electrically insulative tip 114 may have a width that is wider than an outer diameter of the shell 102. The wide tip 114 advantageously distributes the force generated by the pusher pin 100 across a larger area when contacting a die or other DUT as compared to conventional pusher pins, thus reducing the pressure applied to the DUT and decreasing the probability of the DUT becoming damaged through interaction with the pusher pin 100. Additionally, since the tip 114 is electrically insulative, the tip 114 cannot short adjacent circuits that are in contact with the tip 114, thus allowing the use of widths for the second end 120 of the pusher pin 100 that are much wider than conventional pusher pins, thereby allowing contact forces to be advantageously spread much wider than conventional pusher pin designs.

In addition to the electrically insulative tip 114 of the first plunger member 108, the second end 120 of the second plunger member 116 may include an electrically insulative tip 124. The electrically insulative tip 124 may be made from or coated with any of the electrically insulative materials described above, including an electrically non-conductive coating applied over a dielectric or conductive base material, the coating comprised a thin film of ceramic, a form of rubber or latex, plastic, glass, or other suitable electrically insulative material. The electrically insulative tip 124 may be part of the body 152, or be separately connected to the second end 120 of the second plunger member 116. The electrically insulative tip 124 provides an open circuit between the second ends 110, 120 of the pusher pin 100, thus making the pusher pin 100 non-conductive. Having the electrically insulative tips 114, 124 on both ends 110, 120 of the pusher pin 100 advantageously allows the pin 100 to engage circuits from either end of the pin 100 without fear of shorting the circuits though electrical connection with another portion of the pin 100 and another conductive object.

Figure 2:
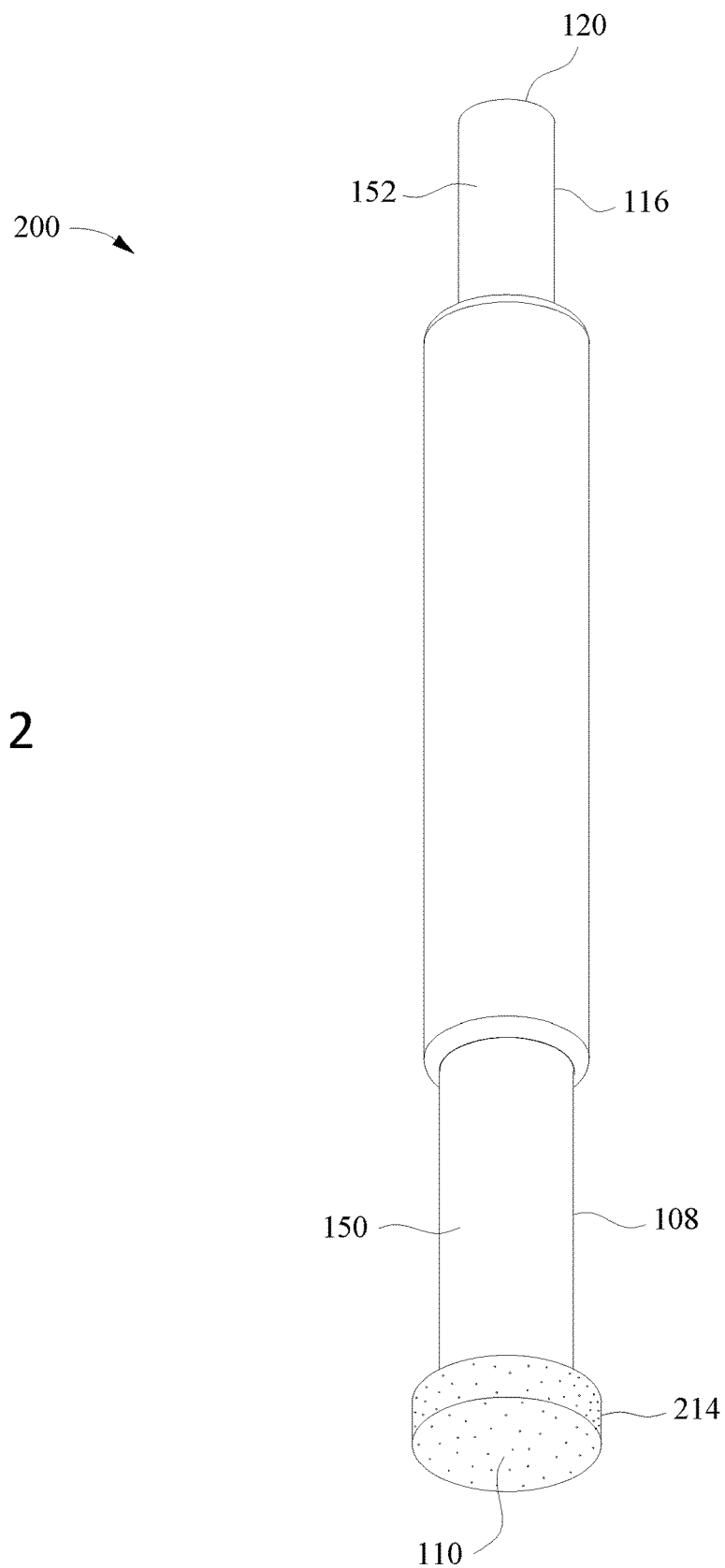
FIG. 2 shows a perspective of an exemplary pusher pin having an electrically insulative tip, according to an embodiment.

FIG. 2 shows a perspective of an exemplary pusher pin 200 having an electrically insulative tip 214, according to an embodiment. The pusher pin 200 may be fabricated the same as the pusher pin 100 described above, except wherein the electrically insulative tip 214 is disposed on the first plunger member 108 without a second electrically insulative tip disposed on the end 120 of the second plunger member 116. The electrically insulative tip 214 may be fabricated from a ceramic, a form of rubber or latex, plastic, glass, or other suitable electrically insulative material. The electrically insulative tip 214 may alternatively be fabricated with an electrically non-conductive coating applied over a dielectric or conductive base material, the coating comprised a thin film of ceramic, a form of rubber or latex, plastic, glass, or other suitable electrically insulative material. The electrically insulative tip 214 may be part of the body 150, or be separately connected to the second end 110 of the first plunger member 108. In embodiments where the electrically insulative tip 214 is separately connected to the second end 110 of the first plunger member 108, the tip 214 may be connected to the body 150 utilizing fasteners, adhesives, swaging, press-fit, threading, pins, or other suitable fastening technique. The electrically insulative tip 114 provides an open circuit between the second ends 110, 120 of the pusher pin 100, thus making the pusher pin 100 non-conductive.

The enlarged width of the electrically insulative tip 114 advantageously distributes the force generated by the pusher pin 100 across a larger area when contacting a die or other DUT as compared to conventional pusher pins, thus decreasing the probability of the DUT becoming damaged through interaction with the pusher pin 100.

Figure 3:
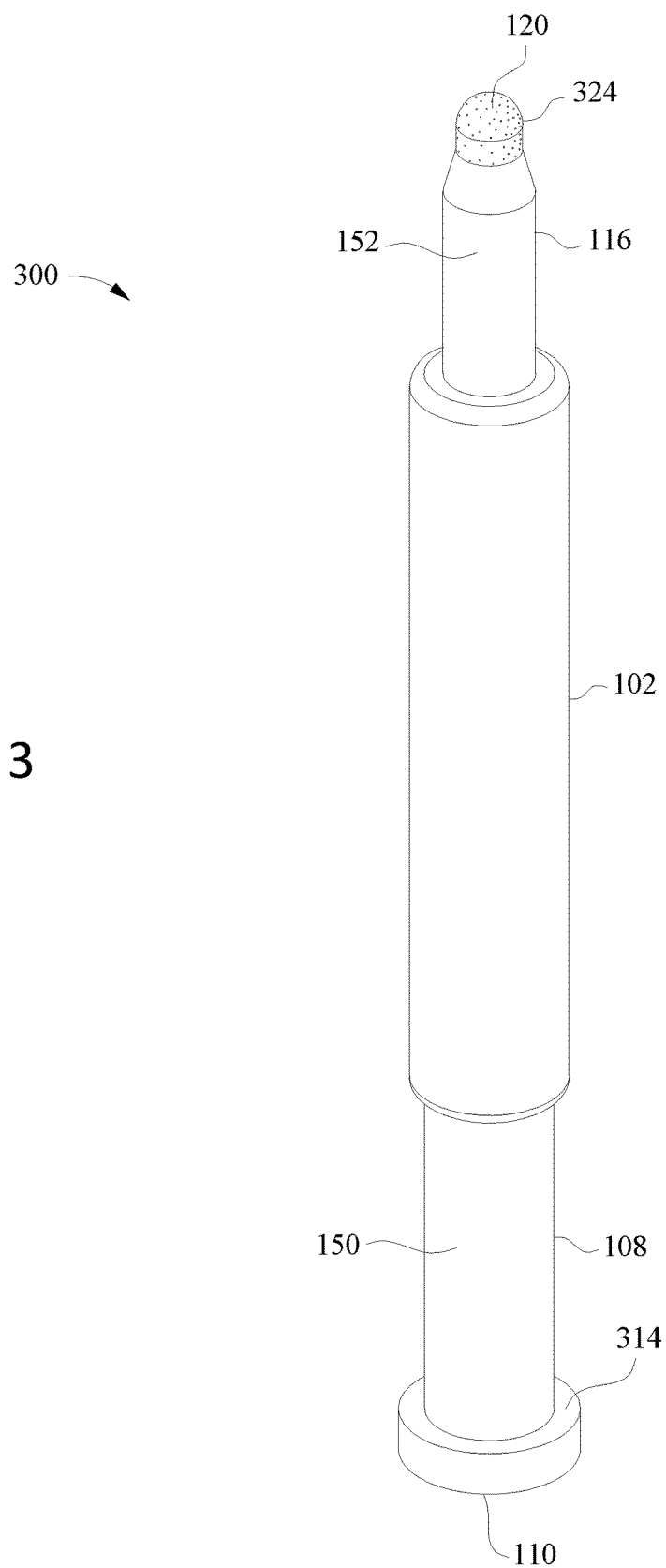
FIG. 3 shows a perspective of an exemplary pusher pin having an electrically insulative tip, according to an embodiment.

FIG. 3 shows a perspective of an exemplary pusher pin 300 having an electrically insulative tip 324, according to an embodiment. The second end 120 of the second plunger member 116 may include the electrically insulative tip 324. The electrically insulative tip 324 may be made from or coated with any of the electrically insulative materials described above. The electrically insulative tip 314 may alternatively be fabricated with an electrically non-conductive coating applied over a dielectric or conductive base material, the coating comprised a thin film of ceramic, a form of rubber or latex, plastic, glass, or other suitable electrically insulative material The electrically insulative tip 324 may be part of the body 152, or be separately connected to the second end 120 of the second plunger member 116. In embodiments where the electrically insulative tip 324 is separately connected to the second end 120 of the second plunger member 116, the tip 324 may be connected to the body 152 utilizing fasteners, adhesives, swaging, press-fit, threading, pins, or other suitable fastening technique.

When the electrically insulative tip 324 is part of the body 152, both the tip 324 and the body 152 may be made of or coated with an electrically insulative material, such as any of the electrically insulative materials described with reference to the body 152 of the second plunger member 116. The tip 324 and the body 152 may be fabricated from the same materials, or fabricated from different materials. Since the tip 324 is electrically insulative, the tip 324 cannot short adjacent circuits that are in contact with the tip 324. The electrically insulative tip 324 provides an open circuit between the second ends 110, 120 of the pusher pin 300, thus making the pusher pin 300 non-conductive.

A tip 314 of the first plunger member 108 is also shown in FIG. 3. The tip 314 may be fabricated from a conductive or non-conductive material. The tip 314 may have a width that is wider than an outer diameter of the shell 102. The wide tip 314 advantageously distributes the force generated by the pusher pin 300 across a larger area when contacting a die or other DUT as compared to conventional pusher pins, thus decreasing the probability of the DUT becoming damaged through interaction with the pusher pin 300. In embodiments that the tip 314 is fabricated from or coated with an electrically insulative material, the tip 314 cannot short adjacent circuits that are in contact with the tip 314, thus allowing the use of widths for the second end 110 of the pusher pin 300 that are much wider than conventional pusher pins, thereby allowing contact forces to be advantageously spread much wider than conventional pusher pin designs.

Figure 4:
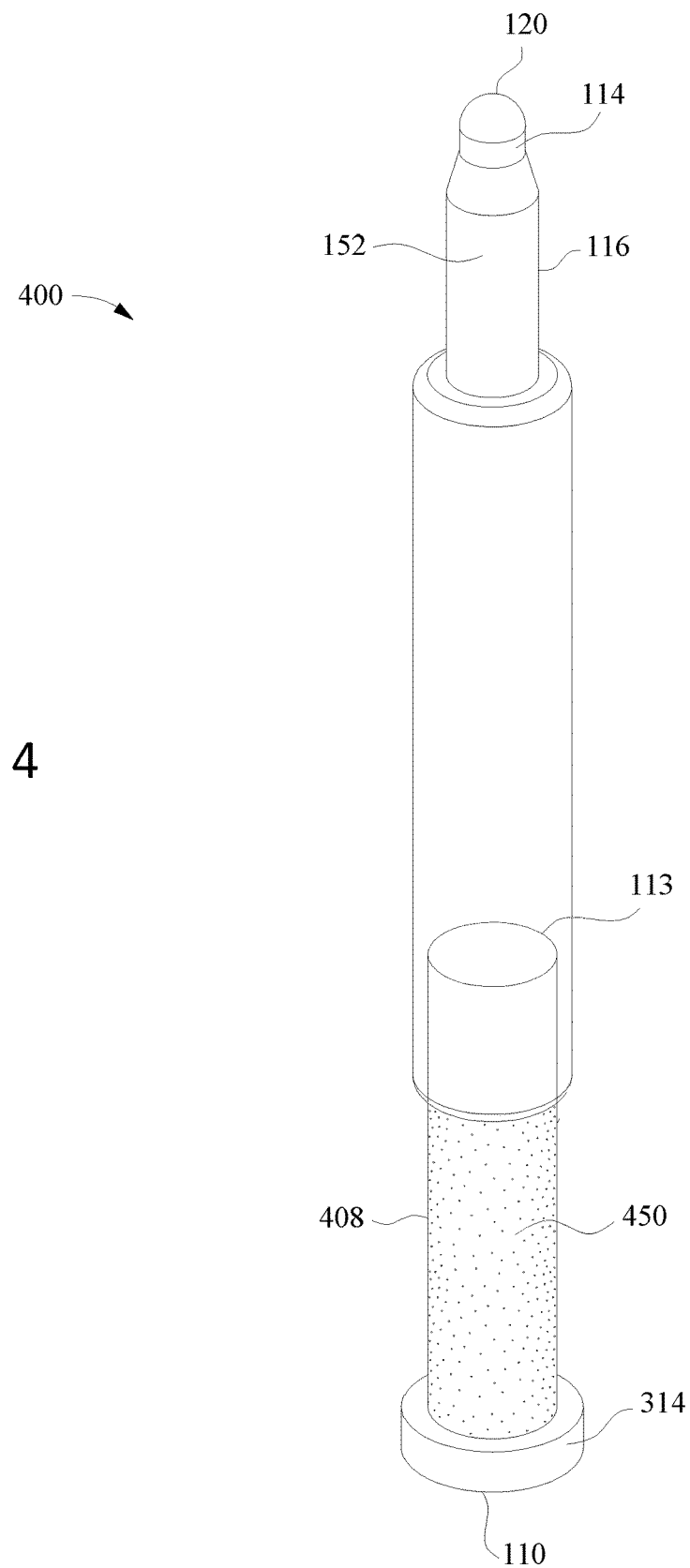
FIG. 4 shows a perspective of an exemplary pusher pin having an electrically insulative first plunger member, according to an embodiment.

FIG. 4 shows a perspective of an exemplary pusher pin 400 having an electrically insulative first plunger member 408, according to an embodiment. The first plunger member 408 has a body 450. The body 450 includes a second end 110. The body 450 may be cylindrical or have another sectional geometry. The body 450 may be fabricated from a material suitably rigid enough to withstand an axial compression force exerted on the pusher pin 400 when in use with a DUT. For example, the body 450 is configured to withstand axial compression force of up to about 1000 grams. In one example, the body 450 maybe fabricated from a carbon-based materials, fiber-reinforced plastic, rigid polymers or other suitable electrically insulative material. The body 450 maybe fabricated form one or more materials, and in one example, at least a portion of the body 450 is fabricated from a dielectric material so that the body 450 is not conductive from the end 113 to the end 110.

The electrically insulative first plunger member 408 may include the tip 314 that is part of the body 450, or is separate from the body 450. In embodiments where the tip 314 is separately connected to the second end 110 of the first plunger member 406, the tip 314 may be connected to the body 450 utilizing fasteners, adhesives, swaging, press-fit, threading, pins, or other suitable fastening technique.

When the tip 314 is part of the body 450, both the tip 314 and the body 450 may be made of or coated with an electrically insulative material, such as any of the electrically insulative materials described with reference to the body 150 of the first plunger member 108. The tip 314 and the body 150 of the first plunger member 408 may be fabricated from the same materials, or fabricated from different materials. Since the first plunger member 408 is electrically insulative, the first plunger member 408 cannot short adjacent circuits that are in contact with the first plunger member 408. The electrically insulative first plunger member 408 provides an open circuit between the second ends 110, 120 of the pusher pin 400, thus making the pusher pin 400 non-conductive.

Figure 5:
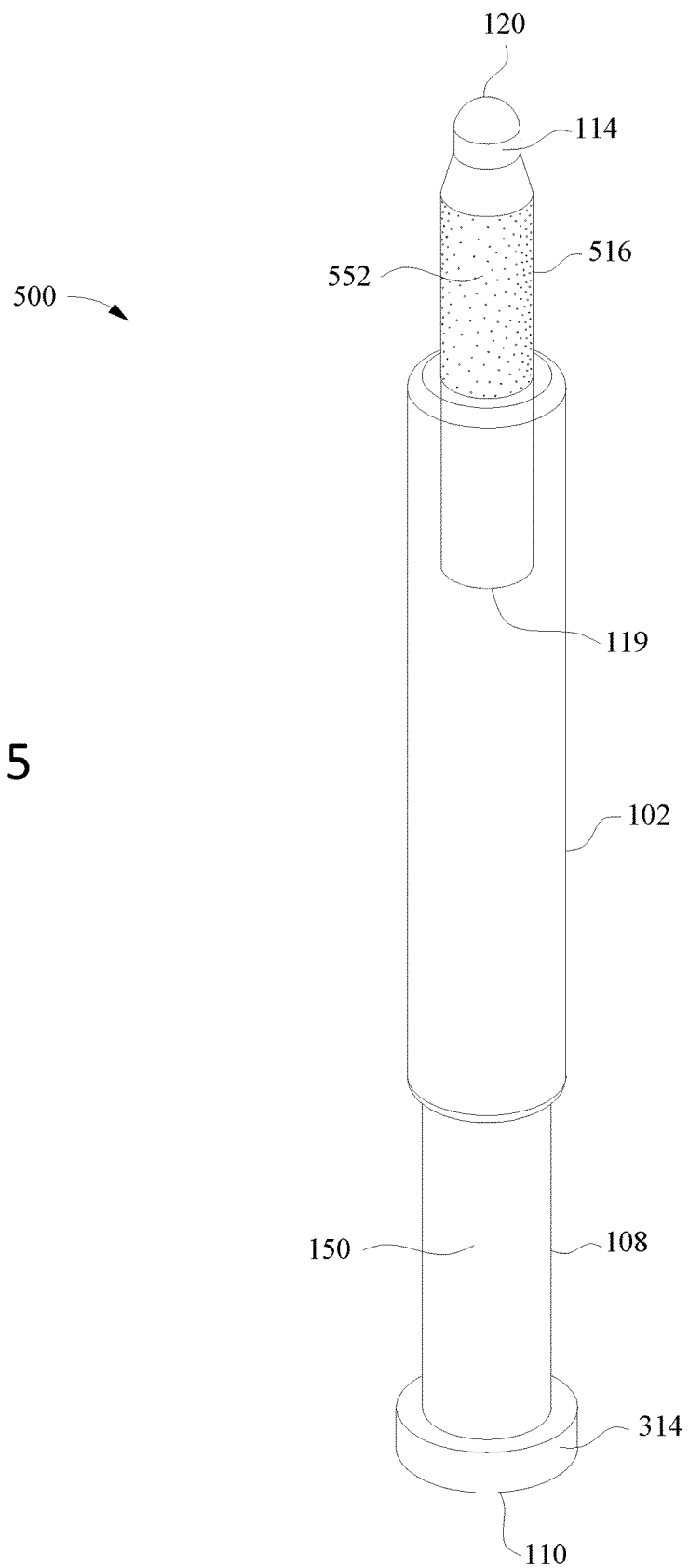
FIG. 5 shows a perspective of an exemplary pusher pin having an electrically insulative second plunger member, according to an embodiment.

FIG. 5 shows a perspective of an exemplary pusher pin 500 having an electrically insulative second plunger member 516, according to an embodiment. The second plunger member 516 has a body 552 fabricated from or coated with an electrically insulative material. The body 552 includes a first end 119 and a second end 120. The body 552 may be cylindrical or have another sectional geometry. The body 552 may be fabricated from a material suitably rigid enough to withstand an axial compression force exerted on the pusher pin 500 when in use with a DUT. For example, the body 552 is configured to withstand axial compression force of up to about 1000 grams. In one example, the body 552 maybe fabricated from a carbon-based materials, fiber-reinforced plastic, rigid polymers or other suitable electrically insulative material. The body 552 maybe fabricated form one or more materials, and in one example, at least a portion of the body 552 is fabricated from a dielectric material so that the body 552 is not conductive from the end 119 to the end 120.

The electrically insulative second plunger member 516 may include the tip 124 that is part of the body 552, or is separate from the body 552. In embodiments where the tip 124 is separately connected to the first end 119 of the second plunger member 516, the tip 124 may be connected to the body 552 utilizing fasteners, adhesives, swaging, press-fit, threading, pins, or other suitable fastening technique.

When the tip 124 is part of the body 552, both the tip 124 and the body 552 may be made of or coated with an electrically insulative material, such as any of the electrically insulative materials described with reference to the body 152 of the second plunger member 116. The tip 124 and the body 552 of the second plunger member 516 may be fabricated from the same materials, or fabricated from different materials. Since the second plunger member 516 is electrically insulative, the second plunger member 516 cannot short adjacent circuits that are in contact with the second plunger member 516. The electrically insulative first plunger member 408 provides an open circuit between the second ends 110, 120 of the pusher pin 500, thus making the pusher pin 500 non-conductive.

Figure 6:
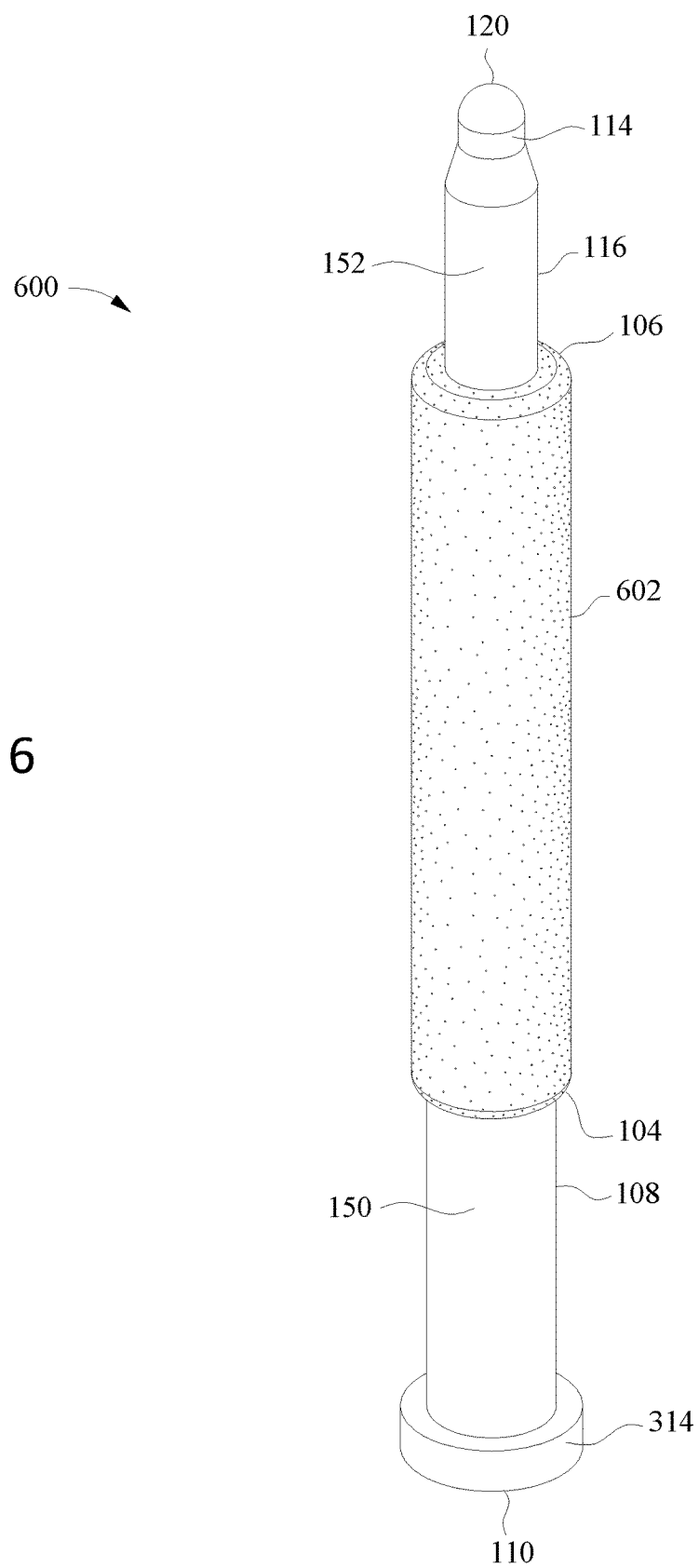
FIG. 6 shows a perspective of an exemplary pusher pin having an electrically insulative shell, according to an embodiment.

FIG. 6 shows a perspective of an exemplary pusher pin 600 having an electrically insulative shell 602, according to an embodiment. The shell 602 optionally may be part of the first plunger member 108. The shell 602 has a first end 104 and a second end 106. The shell 602 may be fabricated from the same electrically-insulative materials as described above with reference to the body 150 of the first plunger member 108. The body 150 and the shell 602 may be fabricated from the same materials, or fabricated from different materials. In some examples, at least one of the shell 602 and the body 150 is electrically non-conductive from the first end 104 to the second end 106, while in other example, both the shell 602 and the body 150 may be conductive end to end.

The shell 602 includes a flange 156 that has an inner diameter sized to allow the body 152 of the second plunger member 116 to extend therethrough so that the second plunger member 116 be displaced axially through the second end 106 of the shell 602 without significant restriction of movement. The flange 156 may be formed by crimping the shell 602, heading, or other suitable technique. The inner diameter of the flange 156 is smaller than a diameter of a head 154 formed at the second end 106 of the second plunger member 116, thus capturing the second plunger member 116 within the cavity 107 by preventing the second plunger member 116 from completely sliding out of the cavity 107 through the second end 106 of the shell 602.

Figure 7:
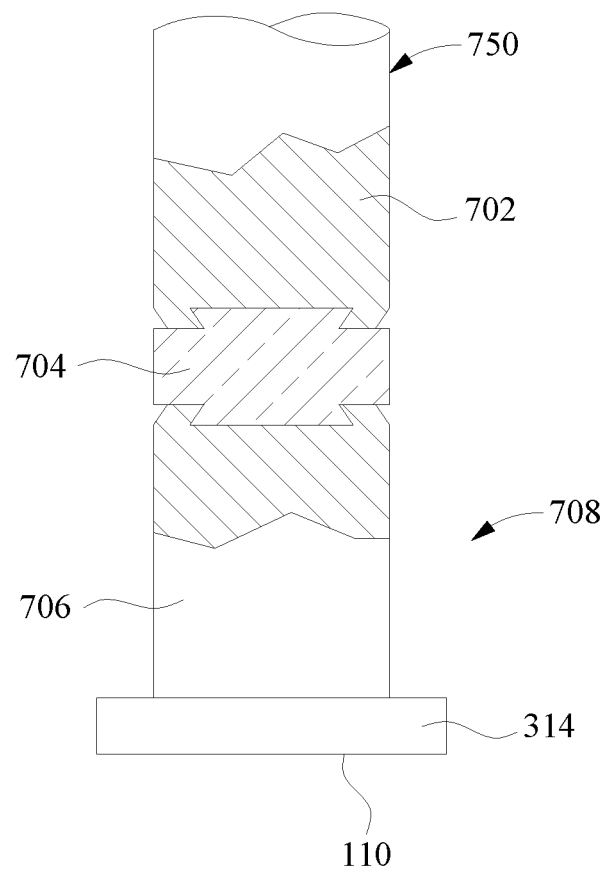
FIG. 7 shows a front elevation of a portion of a first plunger member of an exemplary pusher pin illustrating an electrically insulative portion of the first plunger member, according to an embodiment.

FIG. 7 shows a front elevation of a portion of a first plunger member 708 of an exemplary pusher pin illustrating an electrically insulative portion 704 of the first plunger member 708, according to an embodiment. The first plunger member 708 includes a body 750 made up of the electrically insulative portion 704 and at least one other portion. The at least one other portion of the body 750 of the first plunger member 708 may be fabricated from a conductive material, such as a metal, or from a non-conductive material. All the portions of the body 750 do not have to be fabricated from the same materials, as long as one portion, e.g., the portion 704, is fabricated from a non-electrically conductive material.

In the example depicted in FIG. 7, the first plunger member 708 includes a first portion 702 and a second portion 706 that sandwich the electrically insulative portion 704. However, the electrically insulative portion 704 may be alternatively positioned adjacent one of the portions 702, 706 and not the other portion. The electrically insulative portion 704 makes the body 750 non-conductive. That is, the body 750 is electrically non-conductive along length of the body 750 from the first portion 702 to the second portion 706 due to the intervening non-conductive portion 704. The electrically insulative portion 704 may be fabricated from a ceramic, a form of rubber or latex, plastic, glass, or other suitable electrically insulative material. The electrically insulative portion 704 may be coupled to the utilizing fasteners, adhesives, swaging, press-fit, threading, pins, or other suitable fastening technique.

Although the electrically insulative portion 704 is shown as being part of the first plunger member 708, any one or more of plunger member 116 and the shell 102 may have configured to include an electrically insulative portion 704 as part of the body 152 of the plunger member 116 or shell 102.

Figure 8:
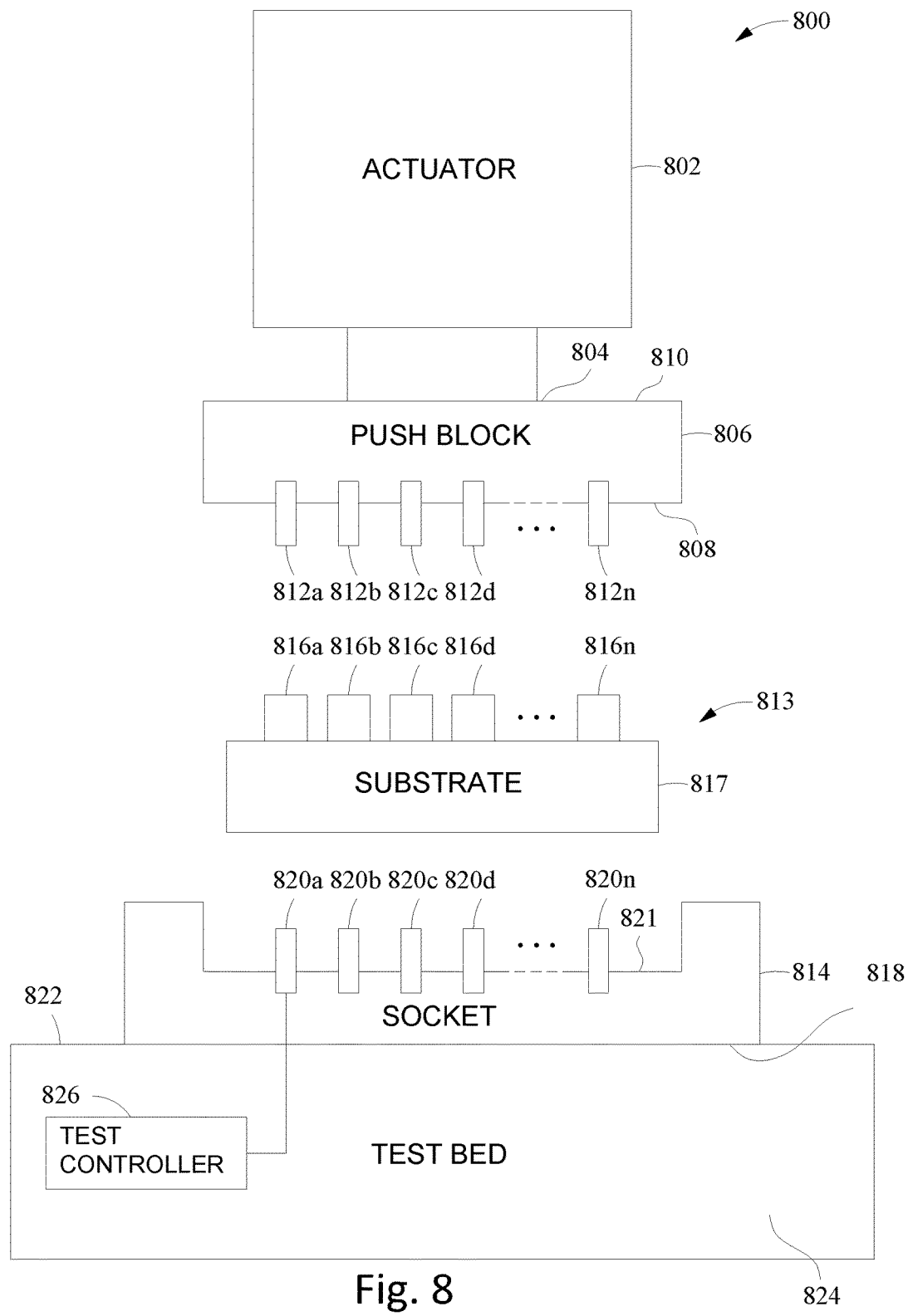
FIG. 8 shows a schematic block diagram of an integrated circuit package test assembly that employs at least one of the pusher pins of FIGS. 1-7.

FIG. 8 shows a schematic block diagram of an integrated circuit package test assembly 800 that employs at least one of the pusher pins 100-700 described with reference FIGS. 1-7, or other similar pusher pin. The test assembly 800 may include an actuator 802 having a bottom end 804. The test assembly 800 may further include a workpress 806 having a top end 810 and a bottom end 808. The top end 810 of the workpress 806 mates with the bottom end 804 of the actuator 802. The bottom end 808 of the workpress 806 is embedded with a first plurality of pusher pins 812a-812n therein. At least one of the pusher pins 812a-812n may be configured as any of the pusher pins 100-800 described above or other similar conductive pusher pin. The test assembly 800 may further include a socket 814 having a top end 821 and a bottom end 818. The top end 821 of the socket 814 may include a second plurality of pusher pins 820a-820n inserted therein. At least one of the pusher pins 820a-820n may be configured as any of the pusher pins 100-700 described above or other similar conductive pusher pin. At least one of the first plurality of pusher pins 812a-812n (e.g., 812a) and/or at least one of the second plurality of pusher pins 820a-820n has a portion made of or coated with an electrically insulative material corresponding to the pusher pins 100-700 described above in connection with FIGS. 1-7, thus advantageously preventing shorting of the DUT. The pusher pins 1000-1500 described below in connection with FIGS. 10-15 may also be utilized in the test assembly 800.

The test assembly 800 is configured to test the DUT. The DUT is illustrated in FIG. 8 as an integrated circuit package 813. The integrated circuit package 813 includes a substrate 817 on which one or more dies 816a-816n are mounted. The integrated circuit package 813 may be configured to be pushed into the socket 814 by the workpress 806 under the influence of a force applied to the workpress 806 by the actuator 802. The integrated circuit package 813 is clamped between the workpress 806 and the socket 814 while under test in the test assembly 800. The test assembly 800 may further include a test bed 824 within which a test controller 826 is electrically coupled to one or more of the pusher pins 820a-820n embedded within the socket 814 that are electrically conductive so that the test controller 826 may communicate with the integrated circuit package 813.

In operation, the actuator 802 is operated to apply a force to displace the workpress 806 towards the chip package 813 disposed in the socket 814. In response, the workpress 806 displaces the first plurality of pusher pins 812a-812n. The pusher pins 812a-812n may engage one or more of the dies 816a-816n located on the substrate 817 and/or other portion(s) of the chip package 813, which, in turn, applies the force over a first area of the one or more dies 816a-816n and/or other portion(s) of the chip package 813 in contact with the pins 812a-812n. This force pushes the chip package 813 into the socket 814 to engage the second plurality of pusher pins 820a-820n in the socket 814 overlying the test bed 824. The test controller 826 may then apply currents, voltages, and/or sensors (not shown) to test the dies 816a-816n through the pusher pins 820a-820n that are electrically conductive, or other electrical interconnect established between the package 813 and socket 814.

Figure 8A:
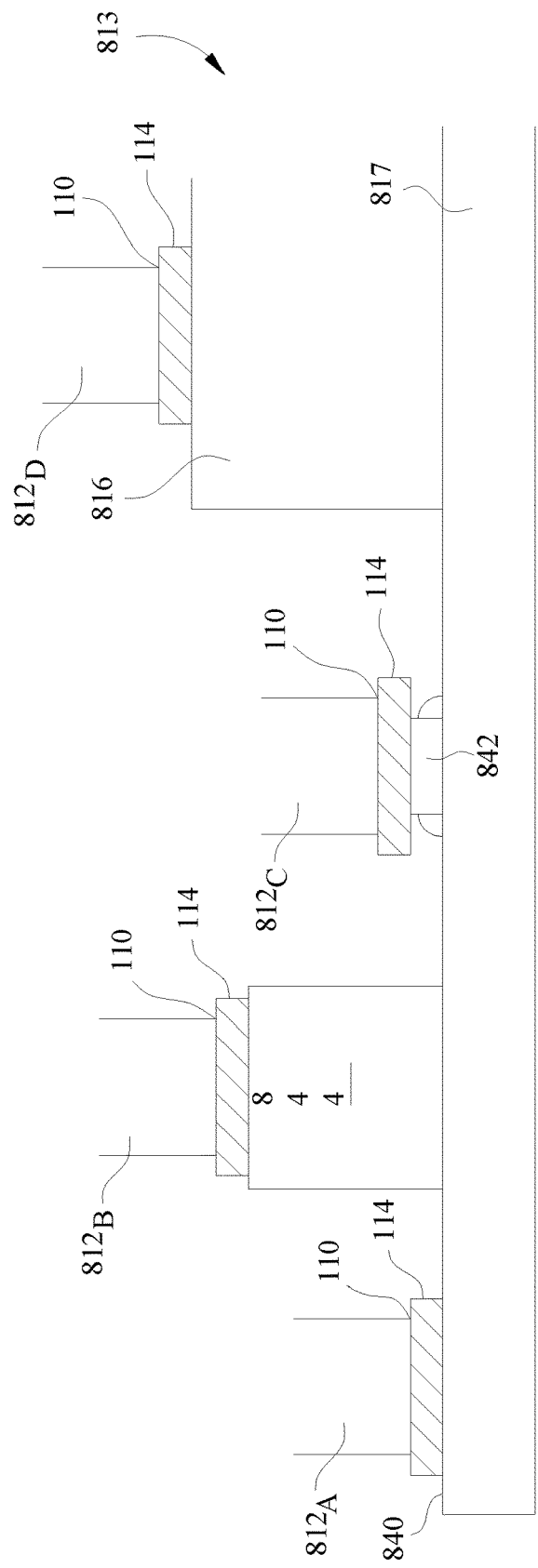
FIG. 8A shows one example of an enlarged portion of a chip package in contact with the pusher pins of FIGS. 1-7 while disposed in an integrated circuit package test assembly.

FIG. 8A shows one example of an enlarged portion of the chip package 813 in contact with the pusher pins 812a-812d. In the example depicted in FIG. 8A, the pusher pin 812a is illustrated contacting a top surface 840 of the substrate 817, the pusher pin 812b is illustrated contacting a surface mounted circuit component 842 disposed on the top surface 840 of the substrate 817, the pusher pin 812c is illustrated contacting a stiffener 844 disposed on the top surface 840 of the substrate 817, and the pusher pin 812d is illustrated contacting a top surface of the die 816. The surface mounted circuit component 842 may be a passive circuit component, such as resistors, capacitors, diodes, inductors and the like. Although the pusher pins 812a-812d are shown in contact with multiple features (i.e., the top surface 840 of the substrate 817, the die 816, the stiffener 844, and the surface mounted circuit component 842) of the chip package 813, the pusher pins 812 may be optionally limited to contact only one type of the features of the chip package 813, to contact only two types of the features feature of the chip package 813, to contact only three types of feature of the chip package 813, or to contact any desired type(s) or combination of types of features of the chip package 813. Returning back to FIG. 8, the pusher pins 812a-812n, 820a-820n may apply the force over a larger area than beds of conventional pusher pins with small contact area tips as is found in the related art. Because the force is distributed over a larger area, reduced pressure is applied to the dies 816a-816n and the substrate 817, thereby reducing the risk of die and/or package delamination and die and/or substrate cracks. Additionally, the pusher pins 812a-812n, 820a-820n that are electrically insulative may contact the integrated circuit package 813 without reduced probability of shorting circuit exposed on the package 813, thereby reducing the potential for damaging the package 813 while in the test assembly 800. Furthermore, as the pressure applied to the dies 816a-816n and the substrate 817 by the pusher pins 812a-812n, 820a-820n is generally decoupled from mechanical manufacturing tolerances, the risk of potential damage the package 813 while in the test assembly 800 is much smaller as compared to conventional metal workpress solutions utilized in conventional test systems. TIM may still optionally be employed for additional force spreading and/or enhancing heat transfer to or from the DUT.

Figure 9:
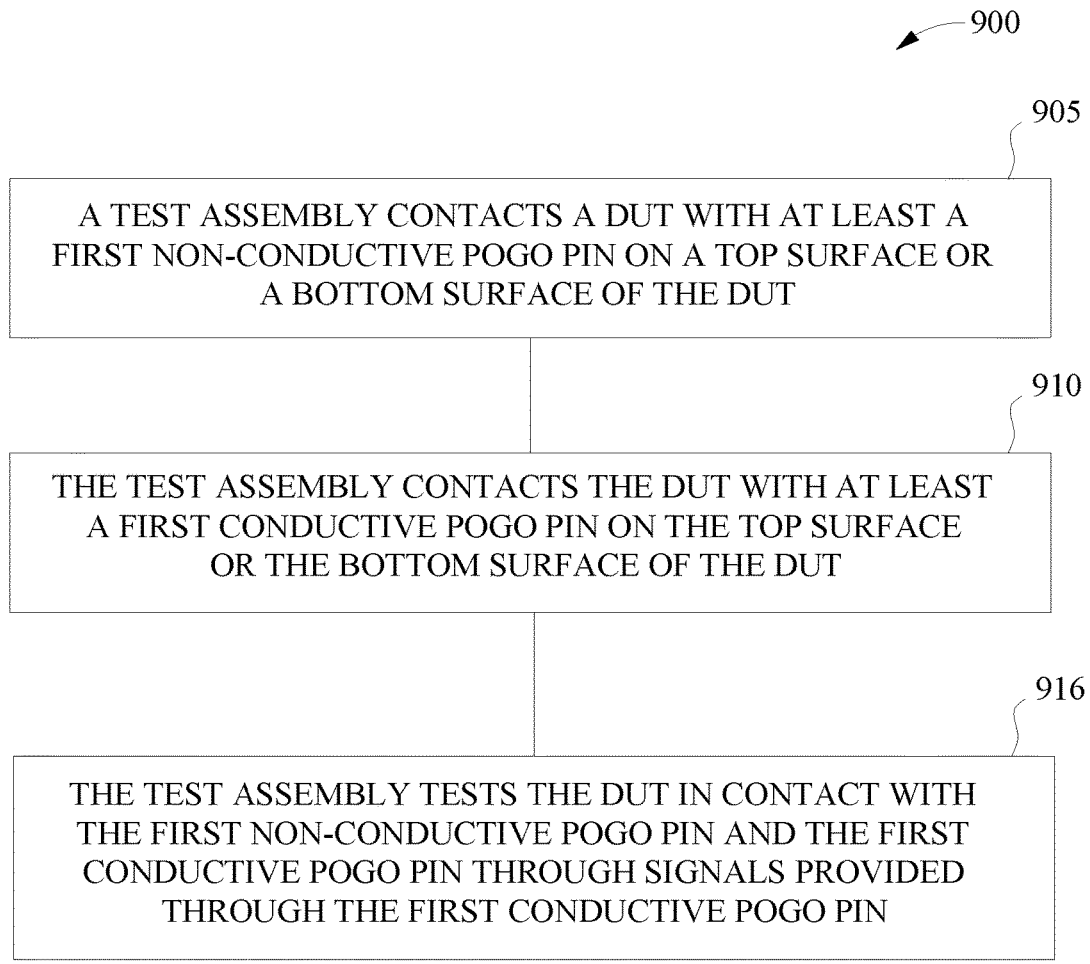
FIG. 9 is a process flow of a method of testing an integrated circuit package in an integrated circuit package test assembly, according to an embodiment.

FIG. 9 is a process flow of a method 900 of testing an integrated circuit package in an integrated circuit package test assembly 800, according to an embodiment. At block 905, the test assembly 800 contacts a DUT with at least a first non-conductive pusher pin on a top surface or a bottom surface of the DUT. At block 910, the test assembly 800 contacts the DUT with at least a first conductive pusher pin on the top surface or the bottom surface of the DUT. At block 915, the test assembly 800 tests the DUT in contact with the first non-conductive pusher pin and the first conductive pusher pin though signals provided through the first conductive pusher pin.

Figures 10, 11, 12, 13:
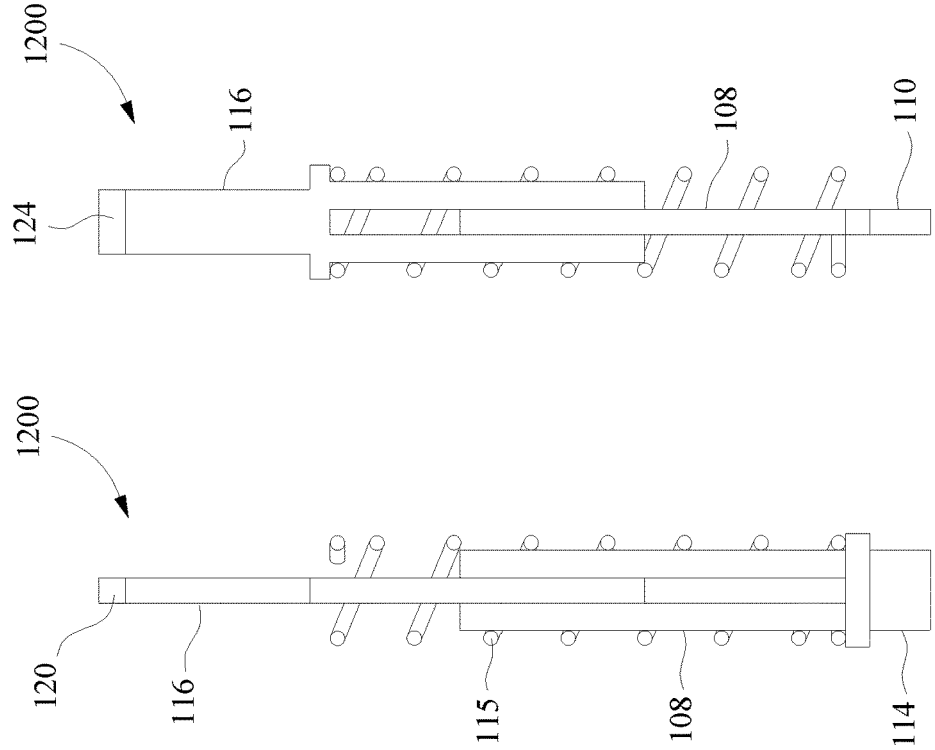
FIG. 10 shows a side view of an exemplary pusher pin having an external spring, according to an embodiment.
FIG. 11 shows a side view of an exemplary pusher pin having a slide mechanism coupling the plunger members of the pusher pin, according to an embodiment.
FIGS. 12-13 shows side and front views of an exemplary pusher pin having an external spring, according to an embodiment.

FIG. 10 shows a side view of an exemplary pusher pin 1000 having an external spring 115, according to an embodiment. The pusher pin 1000 is constructed similar to the pusher pins described above in reference to FIGS. 1-9, except wherein the spring 115 is located outside of the plunger members 108, 116.

The pusher pin 1000 has an electrically insulative path defined between opposite ends 110, 120 of the pusher pin 1000. The electrically insulative path defined between the opposite ends 110, 120 of the pusher pin 1000 may be realized in any number of ways. For example, the first end 110 of a first plunger member 108 may include an electrically insulative tip 114. In another example, a second end 120 of a second plunger member 108 may include an electrically insulative tip 124. Alternatively, at least one of the first and second plunger members 108, 116 may be fabricated from or coated with an electrically insulative material, or include an electrically insulative portion that prevents electrical conduction between the opposite ends 110, 120 of the pusher pin 1000, such as described with reference to FIGS. 4-7.

FIG. 11 shows a side view of an exemplary pusher pin 1100 having a slide mechanism 1102 coupling the plunger members 108, 116 of the pusher pin 1100, according to an embodiment. The slide mechanism 1102 allows one plunger member, e.g., the plunger member 108, to slide linearly relative to the other plunger member, e.g., the plunger member 116. The slide mechanism 1102 may be configured as any suitable linear slide, such as one or more guides slideably mounted to a rail, that enables the plunger members 108, 116 to move relative to each other. A spring 115 is coupled to the plunger members 108, 116 and biases the ends 110, 120 of the pin 1100 in opposite directions.

The plunger members 108, 116 may be fabricated from a stamped material, such as a metal, or be machined, casted, molded or otherwise formed. Alternatively, the plunger members 108, 116 may be extruded, molded or otherwise formed from a rigid plastic.

The pusher pin 1100 has an electrically insulative path defined between opposite ends 110, 120 of the pusher pin 1100. The electrically insulative path defined between the opposite ends 110, 120 of the pusher pin 1000 may be realized in any number of ways. For example, the first end 110 of a first plunger member 108 may include an electrically insulative tip 114. In another example, a second end 120 of a second plunger member 108 may include an electrically insulative tip 124. Alternatively, at least one of the first and second plunger members 108, 116 may be fabricated from or coated with an electrically insulative material, or include an electrically insulative portion that prevents electrical conduction between the opposite ends 110, 120 of the pusher pin 1100, such as described with reference to FIGS. 4-7.

FIGS. 12-13 shows side and front views of an exemplary pusher pin 1200 having an external spring 115, according to an embodiment. The pusher pin 1200 is configured with first and second plunger members 108, 116 having an "H" configuration that guides the relative motion between the plunger members 108, 116. In the embodiment depicted in FIGS. 12-13, each plunger member 108, 116 has a flat form that is turned at an angle, such as 30-90 degrees, relative to the other plunger member 108, 116 so that the legs of the "H" configuration of each plunger member 108, 116 can engage with each other. The plunger members 108, 116 may be fabricated from stamped materials, such as metals or rigid plastic.

As with the other pins described above, the pusher pin 1200 has an electrically insulative path defined between opposite ends 110, 120 of the pusher pin 1200. The electrically insulative path defined between the opposite ends 110, 120 of the pusher pin 1000 may be realized in any number of ways. For example, the first end 110 of a first plunger member 108 may include an electrically insulative tip 114. In another example, a second end 120 of a second plunger member 108 may include an electrically insulative tip 124. Alternatively, at least one of the first and second plunger members 108, 116 may be fabricated from or coated with an electrically insulative material, or include an electrically insulative portion that prevents electrical conduction between the opposite ends 110, 120 of the pusher pin 1200, such as described with reference to FIGS. 4-7.

Figure 14:
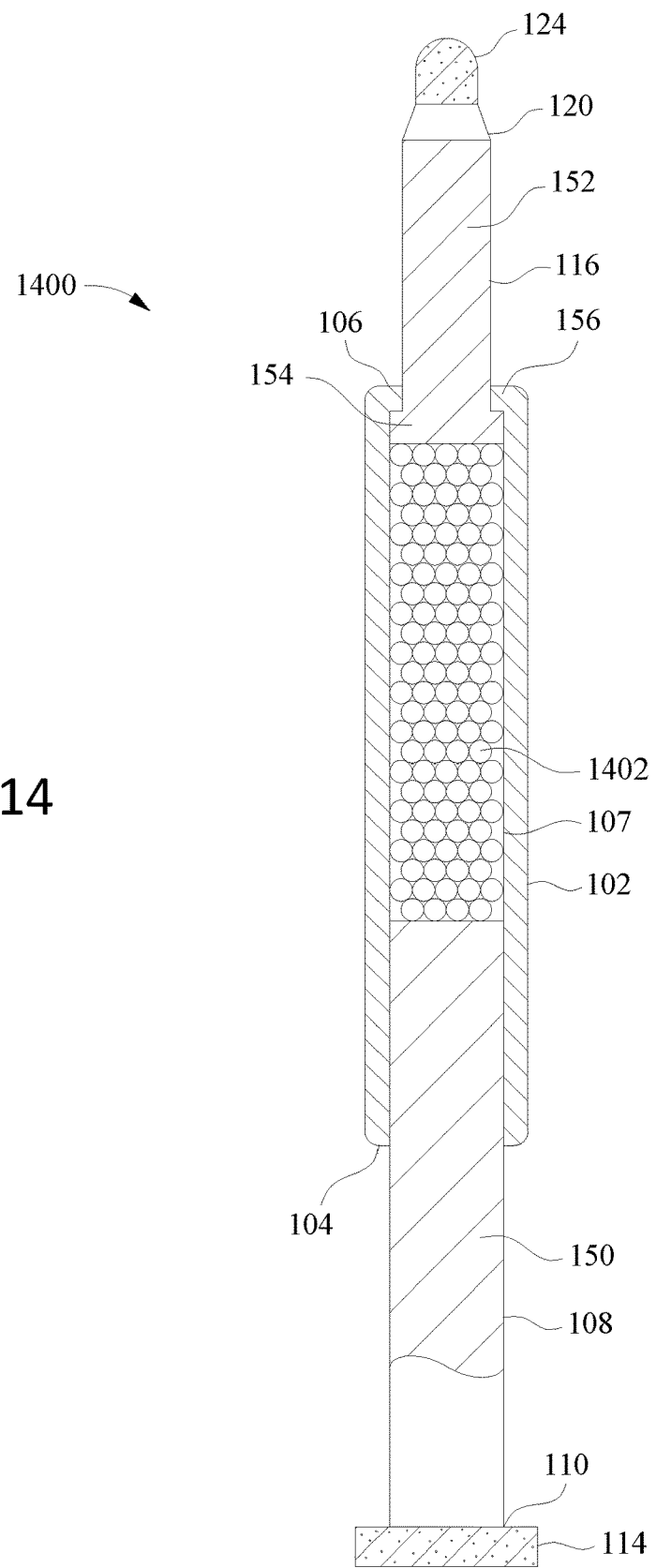
FIG. 14 shows a sectional view of an exemplary pusher pin having a spring fabricated from a compressible material, according to an embodiment.

FIG. 14 shows a sectional view of an exemplary pusher pin 1400 having a spring 1402 fabricated from a compressible, resilient material, according to an embodiment. The compressible, resilient material comprising the spring 1402 may be fabricated from foam, an elastomer or plastic spheres. The spring 1402 may be fabricated from electrically conductive or insulative material.

As with the other pins described above, the pusher pin 1400 has an electrically insulative path defined between opposite ends 110, 120 of the pusher pin 1400. The electrically insulative path defined between the opposite ends 110, 120 of the pusher pin 1000 may be realized in any number of ways. For example, the first end 110 of a first plunger member 108 may include an electrically insulative tip 114. In another example, a second end 120 of a second plunger member 108 may include an electrically insulative tip 124. Alternatively, at least one of the first and second plunger members 108, 116 may be fabricated from or coated with an electrically insulative material, or include an electrically insulative portion that prevents electrical conduction between the opposite ends 110, 120 of the pusher pin 1400, such as described with reference to FIGS. 4-7.

Figure 15:
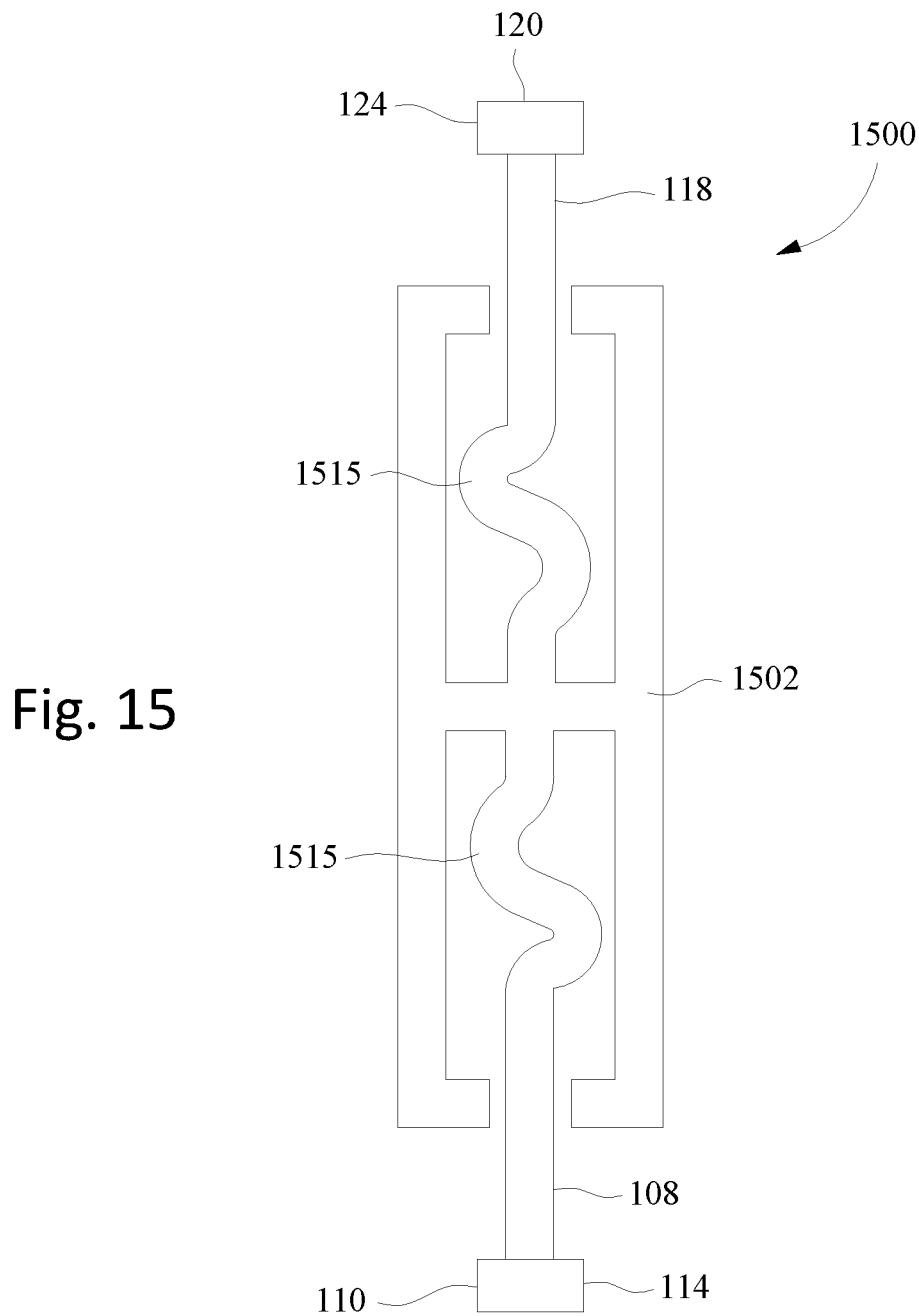
FIG. 15 shows a side view of an exemplary pusher pin having a unitary construction that incorporates a spring form, according to an embodiment.

FIG. 15 shows a side view of an exemplary pusher pin 1500 having a unitary construction that incorporates a spring form, according to an embodiment. That is, at least one spring 1515 and the plunger members 108, 116 are made from a single mass of material to provide the unitary construction. For example, the unitary construction may be achieved through stamping, machining, MEMS fabrication techniques, 3D printing or other suitable technique.

In the embodiment depicted in FIG. 15, two springs 1515 are utilized which are coupled to a frame 1502 at one end. The opposite ends (e.g., ends 110, 120) of each spring 1515 are coupled to a respective one of the plunger members 108, 116. In one example, the springs 1515 are flat springs.

The frame 1502 laterally surrounds the plunger members 108, 116 and springs 1515 to provide a guide that orients the pusher pin 1500 within the receiving hole in which the pusher pin 1500 is formed. The ends 110, 120 extend axially through a gap in the frame 1502 a sufficient distance to allow a desired range of motion of the plunger members 108, 116 without the ends 110, 120 retracting within the bounds of the frame 1502.

As with the other pins described above, the pusher pin 1500 has an electrically insulative path defined between opposite ends 110, 120 of the pusher pin 1500. The electrically insulative path defined between the opposite ends 110, 120 of the pusher pin 1000 may be realized in any number of ways. For example, the first end 110 of a first plunger member 108 may include an electrically insulative tip 114. In another example, a second end 120 of a second plunger member 108 may include an electrically insulative tip 124. Alternatively, at least one of the first and second plunger members 108, 116, springs 1515 may be fabricated from or coated with an electrically insulative material, or include an electrically insulative portion that prevents electrical conduction between the opposite ends 110, 120 of the pusher pin 1500, such as described with reference to FIGS. 4-7. In yet another example, the portion of the frame 1502 separating the springs 1515 may be fabricated from or coated with an electrically insulative so as to provide an open circuit between the ends 110, 120 of the pusher pin 1500.

With all the pusher pins described above, the pusher pins are sized to allow a pitch between axially aligned pusher pins of 1.0 mm centerline to centerline pitch. In other examples, the centerline to centerline pitch may be as small as 0.4 mm. The end to end (i.e., between the ends 110, 120) range of motion (i.e., axial displacement) of the pusher pins may be in the range of 0.7 to 2.0 mm. The pusher pins may generate between 5.0 and 0.15 newtons of force.

While the foregoing is directed to examples of the present disclosure, other and further examples may be devised without departing from the basic scope thereof, and the scope thereof is determined by the claims that follow.

What is claimed is:

1. A pusher pin comprising:
   a first plunger member having a first end and an exposed second end;
   a second plunger member having a first end and an exposed second end, the second plunger member movable relative to the first plunger member, the exposed second ends of the first and second plunger members defining a length of the pusher pin; and
   a spring disposed between the first ends of the first and second plunger members, the spring biasing the exposed second end of the first plunger member away from the exposed second end of the second plunger member, wherein an electrically insulative path is defined between the exposed second end of the first plunger member and the exposed second end of the second plunger member through the pusher pin.

2. The pusher pin of claim 1 further comprising:
   a shell having a cavity formed therein, wherein the second plunger member is partially captured in the cavity and the spring is disposed in the cavity.

3. The pusher pin of claim 2, wherein at least a portion the shell is made from or coated with an electrically insulative material that provides an open circuit between the exposed second ends of the first and second plunger members.

4. The pusher pin of claim 1, wherein the exposed second end of the first plunger member further comprises:
   an electrically insulative tip affixed thereto that provides an open circuit between the exposed second ends of the first and second plunger members.

5. The pusher pin of claim 4, wherein a width of the electrically insulative tip is wider than an axial diameter of the shell.

6. The pusher pin of claim 4, further comprising an electrically insulative tip located at the exposed second end of the second plunger member that provides an open circuit between the exposed second ends of the first and second plunger members.

7. The pusher pin of claim 1, wherein at least a portion of the first plunger member is made of or coated with an electrically insulative material that provides an open circuit between the exposed second ends of the first and second plunger members.

8. The pusher pin of claim 1, wherein at least a portion of at least one of the first and second plunger members is made of or coated with an electrically insulative material that provides an open circuit between the exposed second ends of the first and second plunger members.

9. The pusher pin of claim 1, wherein the spring is made of an electrically non-conductive material that provides an open circuit between the exposed second ends of the first and second plunger members.

10. An integrated circuit package test assembly, comprising:

a workpress having a top end and a bottom end, the bottom end having a first plurality of pusher pins;

a socket having a top end facing the bottom end of the workpress, the top end of the socket having a second plurality of pusher pins;

an actuator configured to move the workpress towards the socket a sufficient distance to cause the first plurality of pins and the second plurality of pins to engage a DUT when disposed in the socket; and an open circuit defined between opposite ends of at least a first pusher pin of the first plurality of pusher pins or at least a second pusher pin of the second plurality of pusher pins.

11. The assembly of claim 10, wherein at least one of the first pusher pin and the second pusher pin comprises:

a first plunger member having a first end and an exposed second end;

a second plunger member having a first end and an exposed second end, the second plunger member movable relative to the first plunger member, the exposed second ends of the first and second plunger members defining a length of the pusher pin; and a spring disposed between the first ends of the first and second plunger members, the spring biasing the exposed second end of the first plunger member away from the exposed second end of the second plunger member, wherein open circuit is defined between the exposed second end of the first plunger member and the exposed second end of the second plunger member through the pusher pin.

12. The assembly of claim 11 further comprising:

a shell having a cavity formed therein, wherein the second plunger member is partially captured in the cavity and the spring is disposed in the cavity.

13. The assembly of claim 12, wherein at least a portion the shell is made from or coated with an electrically insulative material that provides the open circuit between the exposed second ends of the first and second plunger members.

14. The assembly of claim 11, wherein the exposed second end of the first plunger member further comprises:

an electrically insulative tip affixed thereto that provides the open circuit between the exposed second ends of the first and second plunger members.

15. The assembly of claim 14, wherein a width of the electrically insulative tip is wider than an axial diameter of the shell.

16. The assembly of claim 14, wherein the exposed second end of the second plunger member further comprises:

an electrically insulative tip affixed thereto that provides the open circuit between the exposed second ends of the first and second plunger members.

17. The assembly of claim 11, wherein at least a portion of the first plunger member is made of or coated with an electrically insulative material that provides the open circuit between the exposed second ends of the first and second plunger members.

18. The assembly of claim 11, wherein at least a portion of at least one of the first and second plunger members is made of or coated with an electrically insulative material that provides an open circuit between the exposed second ends of the first and second plunger members.

19. The assembly of claim 11, wherein the spring is made of or coated with an electrically non-conductive material that provides the open circuit between the exposed second ends of the first and second plunger members.

20. A method of testing an integrated circuit package in an integrated circuit package test assembly, the method comprising:

contacting a DUT with at least a first non-conductive pusher pin on a top surface or a bottom surface of the DUT, the first non-conductive pusher pin having an open circuit defined between opposite ends of the first non-conductive pusher pin;

contacting the DUT with at least a first conductive pusher pin on the top surface or the bottom surface of the DUT; and testing the DUT in contact with the first non-conductive pusher pin and the first conductive pusher pin though signals provided through the first conductive pusher pin.

* * * * *